US008319149B2

(12) United States Patent
Ma et al.

(10) Patent No.: US 8,319,149 B2
(45) Date of Patent: *Nov. 27, 2012

(54) RADIANT ANNEAL THROUGHPUT OPTIMIZATION AND THERMAL HISTORY MINIMIZATION BY INTERLACING

(75) Inventors: Kai Ma, Palo Alto, CA (US); Abhilash J. Mayur, Salinas, CA (US); Vijay Parihar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 956 days.

This patent is subject to a terminal disclaimer.

(21) Appl. No.: 12/240,035

(22) Filed: Sep. 29, 2008

(65) Prior Publication Data

US 2009/0261078 A1  Oct. 22, 2009

Related U.S. Application Data

(60) Provisional application No. 61/124,523, filed on Apr. 16, 2008.

(51) Int. Cl.
*B23K 26/10* (2006.01)
*B23K 15/00* (2006.01)

(52) U.S. Cl. ........... 219/121.8; 219/121.29; 219/121.81; 219/121.82; 219/121.83; 219/121.61; 219/121.62; 219/121.63

(58) Field of Classification Search ... 219/121.6–121.86
See application file for complete search history.

(56) References Cited

U.S. PATENT DOCUMENTS

| | | | | |
|---|---|---|---|---|
| 3,848,104 A * | 11/1974 | Locke | ...................... | 219/121.65 |
| 4,131,487 A * | 12/1978 | Pearce et al. | ................... | 438/473 |
| 4,372,989 A * | 2/1983 | Menzel | .......................... | 427/555 |
| 4,415,794 A * | 11/1983 | Delfino et al. | ............ | 219/121.85 |
| 6,531,681 B1 | 3/2003 | Markle et al. | .............. | 219/121.8 |
| 6,747,245 B2 * | 6/2004 | Talwar et al. | .............. | 219/121.8 |
| 6,844,523 B2 * | 1/2005 | Yamazaki et al. | ........ | 219/121.66 |
| 6,987,240 B2 * | 1/2006 | Jennings et al. | ............ | 219/121.8 |
| 7,015,422 B2 * | 3/2006 | Timans | ......................... | 219/390 |
| 7,154,066 B2 * | 12/2006 | Talwar et al. | .............. | 219/121.8 |
| 7,238,915 B2 * | 7/2007 | Grek et al. | ................. | 219/121.8 |
| 7,279,657 B2 * | 10/2007 | Hegedus | .................. | 219/121.73 |
| 7,494,272 B2 * | 2/2009 | Thomas et al. | .................. | 374/53 |
| 2002/0091385 A1 * | 7/2002 | Paton et al. | ...................... | 606/51 |
| 2002/0137311 A1 * | 9/2002 | Timans | ......................... | 438/487 |
| 2004/0007470 A1 * | 1/2004 | Smalley | ......................... | 205/118 |
| 2004/0198028 A1 * | 10/2004 | Tanaka et al. | .................. | 438/487 |
| 2005/0269298 A1 * | 12/2005 | Hotta et al. | ................. | 219/121.8 |
| 2006/0102607 A1 * | 5/2006 | Adams et al. | ............ | 219/121.83 |
| 2007/0051708 A1 * | 3/2007 | Talwar et al. | ............ | 219/121.75 |
| 2007/0138151 A1 * | 6/2007 | Tanaka et al. | ............ | 219/121.65 |
| 2008/0121626 A1 * | 5/2008 | Thomas et al. | .......... | 219/121.62 |
| 2008/0173620 A1 * | 7/2008 | Grek et al. | ................. | 219/121.8 |

* cited by examiner

*Primary Examiner* — Tu B Hoang
*Assistant Examiner* — Brett Spurlock
(74) *Attorney, Agent, or Firm* — Robert M. Wallace

(57) ABSTRACT

The time between illumination of adjacent zones of a workpiece edge is extended by a long cool-down period or delay, by interlacing a radiation beam scanning pattern. During the cool-down period, the beam successively scans (along the fast axis) two rows separated by about half the wafer diameter, and travels back and then forth (along the slow axis) across the distance between the two rows, while the radiation beam source continuously generates the beam.

6 Claims, 3 Drawing Sheets

RADIANT ANNEAL THROUGHPUT OPTIMIZATION AND THERMAL HISTORY MINIMIZATION BY INTERLACING

CROSS REFERENCE TO RELATED APPLICATIONS

This application claims the benefit of U.S. Provisional Application Ser. No. 61/124,523, filed Apr. 16, 2008 entitled DSA THROUGHPUT OPTIMIZATION AND THERMAL HISTORY MINIMIZATION BY INTERLACING, by Kai Ma, et al.

BACKGROUND

Thermal processing is required in the fabrication of silicon and other semiconductor integrated circuits formed in silicon wafers or other substrates such as glass panels for displays. The required temperatures may range from relatively low temperatures of less than 250° C. to greater than 1000°, 1200°, or even 1400° C. and may be used for a variety of processes such as dopant implant annealing, crystallization, oxidation, nitridation, silicidation, and chemical vapor deposition as well as others.

For the very shallow circuit features required for ultra-large scale integrated (ULSI) circuits, such as shallow implanted source and drains, thermal diffusion can degrade device geometry. Therefore, it is desired to reduce the total thermal budget in achieving the required thermal processing. The thermal budget may be considered as the total time at high temperatures necessary to achieve the desired processing temperature. Such shallow circuit features are essentially confined to the wafer surface, and annealing them requires only that the wafer surface be heated to the requisite temperature. The time that the wafer surface needs to stay at the highest temperature can be very short.

Rapid thermal processing (RTP) uses radiant lamps which can be very quickly turned on and off to heat only the wafer and not the rest of the chamber. Pulsed laser annealing using very short (about 20 ns) laser pulses is effective for heating only the surface layer and not the underlying wafer, thus allowing very short ramp up and ramp down rates.

A more recently developed approach in various forms, sometimes called thermal flux laser annealing or dynamic surface annealing (DSA), is described by Jennings et al. in PCT Appln. No. PCT/2003/00196966 based upon U.S. patent application Ser. No. 10/325,497, filed Dec. 18, 2002 and incorporated herein by reference in its entirety. Similar techniques are disclosed in U.S. Pat. No. 6,531,681 to Markle and U.S. Pat. No. 6,747,245 to Talwar.

The Jennings and Markle versions use CW diode lasers to produce very intense beams of light that strike the wafer as a thin long line of radiation. The line is then scanned over the surface of the wafer in a direction perpendicular to the long dimension of the line beam.

SUMMARY

A method is provided for thermally processing a workpiece such as a semiconductor wafer, for example. In some embodiments, the method may include generating a beam of radiation and projecting the beam onto the workpiece surface as a two-dimensional rectangular line beam having a long dimension L along a first axis and a short dimension along a second axis. The method may further include interleaving (a) scanning of the line beam along successive rows in a first half of the workpiece surface in a first direction parallel to the second axis with (b) scanning of the line beam along successive rows in a second half of the workpiece surface in a second direction opposite the first direction. Since the beam is scanned along the second axis and is translated to successive rows along the first axis, its progress along the second axis is faster, so that the second axis may be referred to as the fast axis while the first axis may be referred to as the slow axis.

The interleaving may be carried out by scanning in a first direction a row in the first half of the workpiece, first translating the beam parallel to the first axis to the second half of the workpiece, scanning in the opposite direction a corresponding row in the second half and second translating the beam to the first half. The cycle may then be repeated successively until the entire workpiece has been scanned. The first translating of the beam (from the first half to the second half of the workpiece) may span, for example, a distance corresponding to half of the diameter D of the workpiece. The second translating of the beam (from the second half to the first half of the workpiece) may span, for example, a distance corresponding to half the diameter of the wafer minus a beam stepping distance S defined along the slow axis. The beam stepping distance S is a function of the beam length L along the slow axis and the overlap proportion or percentage, OVLP, of adjacent rows scanned by the beam along the fast axis. In one embodiment, the beam stepping distance is defined as $$S=(1-OVLP)L.$$

The overlap percentage may be selected to optimize uniformity and may be in a range of, for example about 20% to about 80%.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
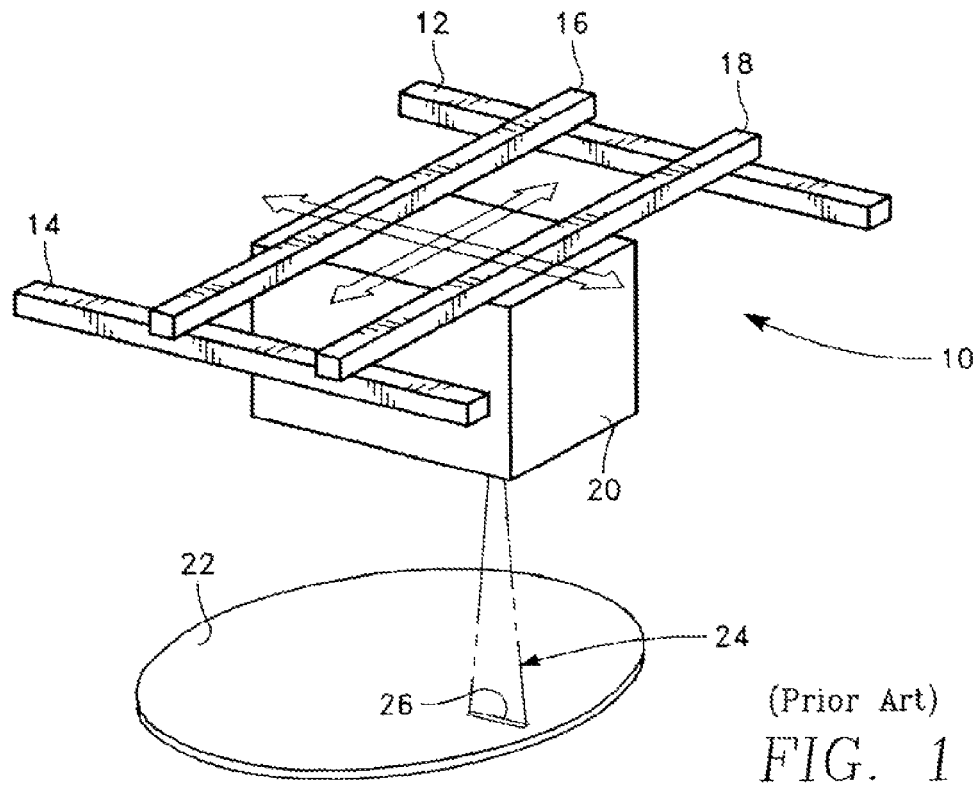
FIG. 1 depicts a beam scanning assembly for a DSA apparatus.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

One embodiment of the apparatus described in the above-referenced application by Jennings et al. is illustrated in the schematic orthographic representation of FIG. 1. A beam-scanning assembly or gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics to produce a downwardly directed fan-shaped beam 24 that strikes the wafer 22 (or is projected on the wafer) as a two-dimensional rectangular line beam 26. The long dimension of the line beam 26 extends generally parallel to the fixed rails 12, 14, in a direction defined as the slow axis. Exemplary dimensions of the line beam 26 include a length along the slow axis, L, of 1 cm and a width of 66 microns with an exemplary power density of 220 kW/cm$^2$. (Alternatively, the beam source and associated optics may be stationary while the wafer is supported on a stage which scans it in two dimensions.)

In typical operation, the gantry beams 16, 18 are set at a particular position along the fixed rails 12, 14 and the beam source 20 is moved at a uniform speed along the gantry beams 16, 18 to scan the line beam 26 perpendicularly to its long dimension in a direction conveniently called the fast direction. The line beam 26 is thereby scanned from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and therefore act as a heat sink to quickly cool the surface region. The rate at which the beam is scanned across the wafer surface is sufficiently high so that the depth to which the wafer is heated to the requisite temperature (e.g., near the melting temperature of silicon) is confined to the shallow surface region on the order of only microns in depth within which the circuit features (e.g., implanted transistor sources and drains) are formed. This leaves the remainder or bulk of the wafer at a cool temperature, thereby providing a large heat sink that rapidly cools the shallow heated zone, minimizing the time spent at the elevated temperature.

Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. In conventional practice, the alternating fast and slow scanning are repeated, in a serpentine path of the beam source 20, until the entire wafer 22 has been thermally processed.

Figure 2:
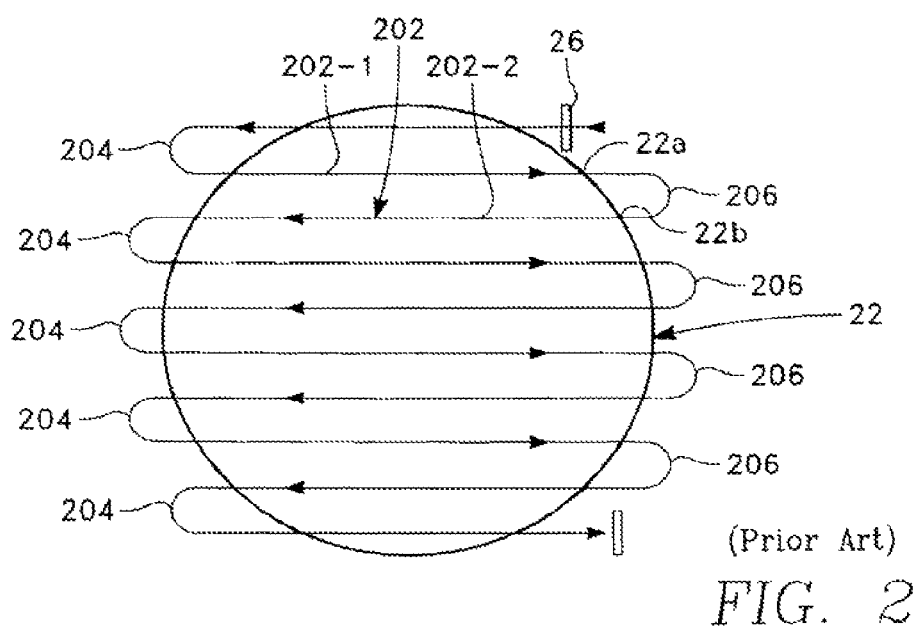
FIG. 2 depicts a conventional beam scanning pattern.
Figure 3:
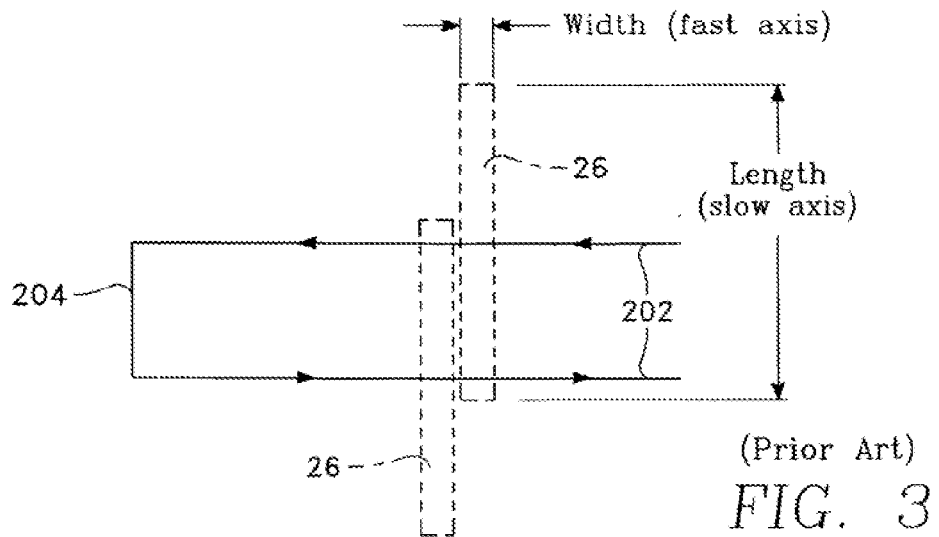
FIG. 3 is an expanded view of a portion of FIG. 2 and depicts the relationship between path spacing and beam size.

FIG. 2 depicts a typical serpentine path of the line beam 26 across the wafer. The scanning pattern of FIG. 2 includes multiple rows 202 extending parallel to the fast axis connected by left-to-right transition paths 204 extending generally parallel to the slow axis and right-to-left transition paths 206 extending generally parallel to the slow axis. The spacing along the slow axis between adjacent rows 202 may correspond to the beam spot length L (e.g., 1 cm) as depicted in FIG. 3, requiring about thirty rows to scan the surface of a 300 mm wafer. Optionally, the spacing between rows may be reduced so that beam patterns overlap, in which case the number of rows, n, required to scan the entire wafer may be greater.

Figure 6:
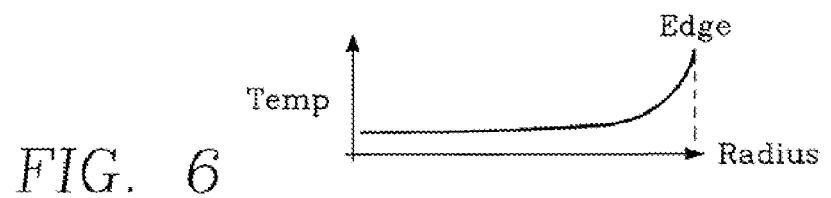
FIG. 6 depicts a radial distribution of temperature on the wafer surface.

The Problem of Thermal Stress at the Wafer Edge:

The scanning pattern of FIG. 2 causes adjacent portions of the wafer edge covered by adjacent rows 202 to be heated in rapid succession. Specifically, there is minimal time for the first wafer edge portion (e.g., wafer edge portion 22a) at the end of one row 202-1 to cool down before an adjacent wafer edge portion 22b is heated at the beginning of the next row 202-2. This increases the likelihood of wafer breakage due to thermal stress for two reasons. First, the edge of the wafer 22 has the least thermal communication with the bulk of the wafer and therefore retains heat longer than any other portion of the wafer 22. As a result, the radial temperature distribution of the wafer surface (depicted in the graph of FIG. 6) exhibits a very high peak at the wafer edge as the line beam 26 nears the end of one row (e.g., the row 202-1) or the beginning of the next row (e.g., the row 202-2). Secondly, the wafer edge tends to have more crystalline imperfections (e.g., micro-fissures or cracks) than any other portion of the wafer 22. The combination of higher structural defect density at the wafer edge with higher thermal stress or temperature gradient at the wafer edge (FIG. 6) greatly increases the probability of wafer breakage during beam scanning, reducing process yield due to wafer breakage.

The Problem of Non-Uniform Scanning of the Wafer:

In the scanning pattern of FIG. 2, adjacent rows are scanned in opposite directions. We have discovered that such scanning of adjacent rows in opposite directions creates certain problems that limit uniformity of scanning. These problems stem from non-uniformity of the spatial distribution of beam intensity in the area illuminated by the beam at any instant in time.

Figure 4:
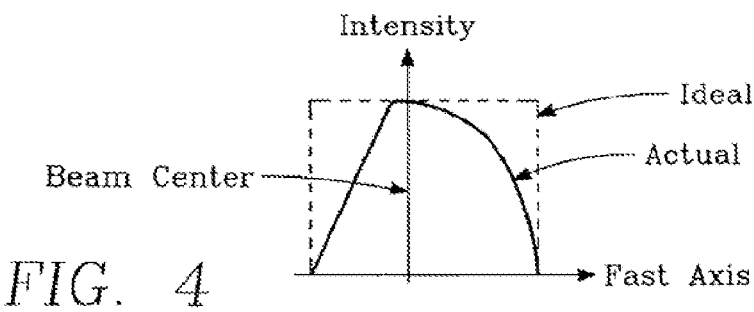
FIG. 4 is graph depicting beam intensity distribution along the fast axis.
Figure 5:
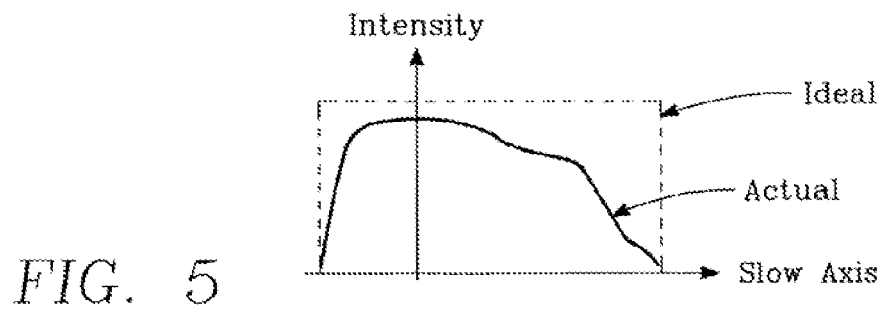
FIG. 5 is graph depicting beam intensity distribution along the slow axis.

The distribution of optical intensity along the fast axis within the line beam 26 typically does not correspond to an ideal or perfect uniformity, depicted in dashed line in the graph of FIG. 4. Instead, the actual intensity distribution along the fast axis is typically non-uniform, an example of which is depicted in solid line in the graph of FIG. 4. The distribution of optical intensity along the slow axis within the line beam 26 typically does not correspond to an ideal or perfect uniformity, depicted in dashed line in the graph of FIG. 5. Instead, the actual intensity distribution along the slow axis is typically non-uniform, an example of which is depicted in solid line in the graph of FIG. 5.

In order to reduce or compensate for the effects of non-uniform distribution of the laser beam intensity along the slow axis, the stepping distance S (center-to-center spacing) between adjacent rows is reduced to be less than the beam length L along the slow axis so that the beam-scanned areas of adjacent rows overlap one another, as depicted in FIG. 3. The overlap may be expressed as the decimal equivalent of the proportion or percentage (OVLP) by which the rows overlap. This proportion, OVLP, may be within a range of about 20% (or 0.20) to about 80% (or 0.80), and is selected to optimize uniformity of heat distribution along the slow axis. In another embodiment, the OVLP may be in a range of about 40% to 60%. This optimization can be performed by the skilled worker using empirical results to find an optimum overlap OVLP. The stepping distance S (i.e., the center-to-center spacing between adjacent rows) is a function of the slow axis beam length L and of the overlap proportion OVLP:

$$S = (1 - OVLP)L.$$

Selection of the best overlap proportion, OVLP, that optimizes uniformity along the slow axis is made empirically by trial and error. Non-uniformity along the slow axis persists even though the optimum overlap is employed. We have discovered that this persistent non-uniformity along the slow axis arises from the effect of the non-uniform thermal history attributable to the scanning of adjacent rows in opposite directions along the fast axis. The thermal history is created by the fast axis distribution of the beam intensity along the fast axis, depicted in the example of FIG. 4. The thermal history is reversed with the scanning of each row, and this reversal affects the optimum stepping distance S between adjacent rows. The effect is that the optimum S for one pair of adjacent rows is not the same as the optimum S for another pair of adjacent rows. Our solution to this problem is to scan adjacent rows in the same direction. The problem is how to scan adjacent rows in the same direction without having to turn off the laser during scanning of the wafer. Turning off the laser would shorten its useful lifetime.

Figures 7, 8:
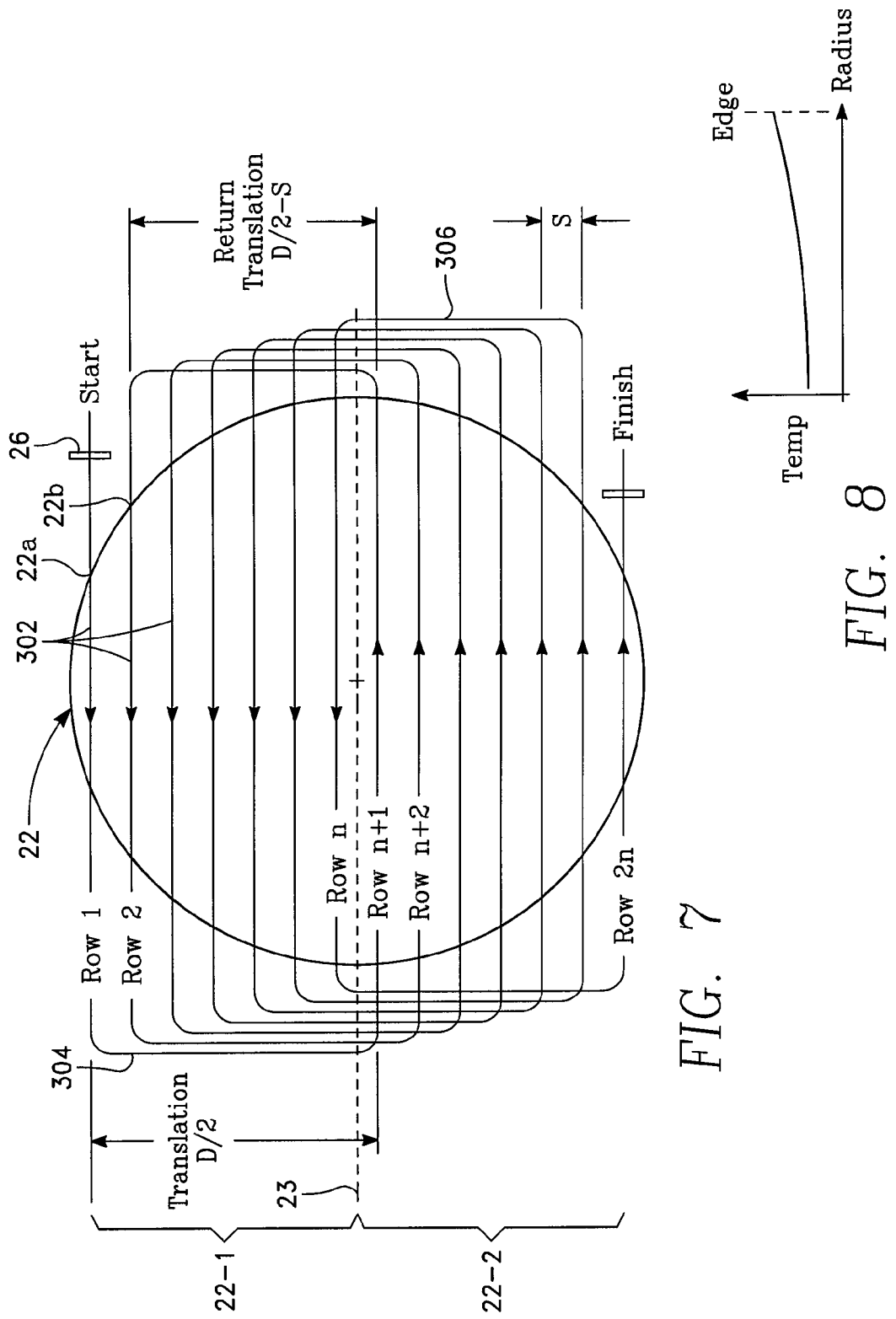
FIG. 7 depicts a beam scanning pattern in accordance with one embodiment.
FIG. 8 depicts a radial temperature distribution obtained in the beam scanning pattern of FIG. 7.

Solution to the Problem of Thermal Stress at the Wafer Edge:

The problem of thermal stress at the wafer edge is solved in the embodiment of FIG. 7, in which successive beam scans of adjacent zones of the wafer edge are time-delayed by a cool-down period. This feature is realized without having to turn the laser off and on. In order to provide for both (1) a cool-down period between successive beam scans of the wafer edge and (2) continuous laser operation, the laser beam scanning pattern is interlaced. Such interlacing, as carried out in the embodiment of FIG. 7, involves scanning a row in one half of the wafer along the fast axis in a first direction (e.g., right-to-left), translating the beam by about half of the wafer diameter along the slow axis to a corresponding row in the other half of the wafer and then scanning that row in the opposite direction (e.g., left-to-right) along the fast axis. Then, the beam is translated along the slow axis back to the first half of the wafer by a distance of half a wafer diameter less the stepping distance S (i.e., the center-to-center spacing) between adjacent rows. This places the beam in the next row to be scanned in the first half of the wafer. This next row is then scanned along the fast axis in the same direction (e.g., right-to-left) as the adjacent row was previously scanned.

The cool-down period or time duration between scanning of two adjacent rows is the time required to (a) translate the beam from one half of wafer to the other half, (b) scan a row in the other half of the wafer, and (c) translate the beam back to the first half of the wafer for scanning of he next row in the first half. This time duration is sufficiently long to ensure that the initial wafer edge spot (e.g., the wafer edge spot $22a$) has significantly cooled before the adjacent wafer edge spot (e.g., the wafer edge spot $22b$) is illuminated by the line beam 26.

Solution to the Problem of Non-Uniform Scanning:

The embodiment of FIG. 7 solves the problem of persistent non-uniformity by scanning all rows in each half of the wafer in the same direction. This solves the problem because there is no reversal of thermal history between adjacent rows within any particular half of the wafer. As a result, there is little or no variation in the ideal overlap between adjacent rows for optimum slow-axis uniformity. We have discovered that this feature minimizes the persistent non-uniformity discussed above. Specifically, once an ideal value for the row-to-row overlap, OVLP, has been found to optimize uniformity along the slow axis, it applies to all rows, and the ideal slow axis uniformity is realized in all rows.

Method of the Embodiment of FIG. 7:

Referring to FIG. 7, the beam scanning pattern consists of multiple rows 302 parallel to the fast axis and multiple row-to-row transition paths parallel to the slow axis, including left-to-right transition paths 304 and right-to-left transition paths 306. The wafer 22 is divided into upper and lower halves 22-1, 22-2 by an imaginary (dashed-line) boundary 23. The rows 302 in the upper half 22-1 are labeled as rows 1 through n while the rows 302 in the lower half 22-2 are labeled rows n+1 through 2n, where n is the number of rows in each of the two halves 22-1, 22-2 of the wafer 22. The width of each row corresponds to the slow axis beam length L. The stepping distance S is the center-to-center spacing between successive rows. The left-to-right transition paths 304 each have a length equal to half the wafer diameter, D/2. This corresponds to the center-to-center distance between n rows, which is n×s. The right-to-left transition paths 306 each have a length equal to the half the wafer diameter, D/2, less one row-to-row stepping distance, S, or D/2−S. This corresponds to the center-to-center distance between n−1 rows, which is (n−1)×s.

The stepping distance S (i.e., the center-to-center spacing between adjacent rows) is a function of the slow axis beam length L and of the overlap proportion OVLP:

$$S = (1 - OVLP)L.$$

Selection of the best overlap proportion, OVLP, that optimizes uniformity along the slow axis is made empirically by trial and error.

The scanning sequence is as follows: The line beam 26 scans right-to-left along row 1 in the upper wafer half 22-1 along the fast axis. The line beam 26 is then translated down along the left-to-right transition path 304 along the slow axis to reach row n+1 in the lower wafer half 22-2, so that the line beam 26 is translated by a distance of n×S. The line beam 26 then scans row n+1 from left to right. Then, the line beam is translated up the right-to-left transition path 304 to reach row 2 in the upper wafer half 22-1, so that the line beam 26 is translated by a distance of (n−1)×S. Then, the entire cycle is repeated, so that beam scanning of each row in the upper workpiece half 22-1 is interlaced with beam scanning of each row in the lower workpiece half 22-2.

As described above, each transition path 304 spans n rows (corresponding to one-half the wafer diameter) while each transition path 306 spans n−1 rows (corresponding to nearly one-half the wafer diameter), so that there is a one-row difference between them. The one-row difference between the lengths of the opposing transition paths 304, 306 ensures a row-by-row progression of the beam in each wafer half. The time between beam exposures of adjacent beam spots on the wafer edge (e.g., the adjacent wafer edge spots $22a$, $22b$) is the maximum possible while allowing for continued movement of the line beam 26 to advance the scanning process. This avoids compromising productivity while at the same time allowing sufficient time for cooling of a previously scanned wafer edge portion, enabling thermal history to be minimized by cooling. This minimizes the temperature gradient at the wafer edge, as depicted in the graph of FIG. 8. The reduced temperature gradient solves the problem of wafer breakage, greatly enhancing yield. Another advantage is that there is no need to turn off the laser, which enables the laser life time to be prolonged by allowing it to operate continuously.

While the workpiece is depicted in the drawings as a circular wafer, it may be square or rectangular, as in the case of a flat panel display.

While the foregoing is directed to embodiments of the present invention, other and further embodiments of the invention may be devised without departing from the basic scope thereof, and the scope thereof is determined by the claims that follow.

What is claimed is:

1. A method of processing a workpiece having a workpiece surface to be treated, comprising:
   generating a beam of radiation and projecting said beam onto said workpiece surface as a two-dimensional rectangular line beam having a long dimension L along a first axis and a short dimension along a second axis;
   repetitively performing the following with respect to first and second halves of said workpiece surface, said first and second halves being separated by an imaginary boundary line parallel to said second axis:
   (a) scanning said beam in a first direction parallel to said second axis in a row located in said first half of said workpiece surface;
   (b) first translating said beam in a direction parallel to said first axis and toward said second half of said workpiece surface by a distance of approximately n·S, wherein S is a stepping distance which is a center-to-center spacing between successive rows and n is an integer such that n·S equals about half of a diameter of said workpiece;
   (c) scanning said beam in a second direction parallel to said second axis and opposite said first direction in a row located in said second half of said workpiece surface;
   (d) second translating said beam in a direction parallel to said first axis and toward said first half of said workpiece surface by a distance of approximately (n−1)·S;
   wherein S and L are related by an overlap (OVLP) of adjacent rows as follows:

$S=(1-OVLP)L;$ and wherein scanning of said beam in said first half of said workpiece surface is performed in said first direction only and scanning of said beam in said second half of said workpiece surface is performed in said second direction only.

2. The method of claim 1 wherein OVLP is in a range of about 20% to about 80%.

3. The method of claim 1 wherein said second axis corresponds to the direction along which the beam is scanned and said first axis corresponds to the direction along which the beam is translated between successive rows, whereby movement of the beam along said second axis is faster than along said first axis.

4. A method of processing a workpiece having a workpiece surface to be treated, comprising:
   generating a beam of radiation and projecting said beam onto said workpiece surface as a two-dimensional rectangular line beam having a long dimension L along a first axis and a short dimension along a second axis;
   interleaving (a) scanning said line beam in successive rows in a first half of said workpiece surface in a first direction parallel to said second axis with (b) scanning said line beam in successive rows in a second half of said workpiece surface in a second direction opposite said first direction, said first and second halves being separated by an imaginary boundary line parallel to said second axis;
   wherein said interleaving comprises:
      first translating said beam in a direction parallel to said first axis and toward said second half of said workpiece surface by a distance of approximately n·S after scanning a row in said first half and before scanning a corresponding row in said second half, wherein n is an interger such that n·S is about one half of a diameter of said workpiece; and
      second translating said beam in a direction parallel to said first axis and toward said first half of said workpiece surface by a distance of approximately (n−1)·S after scanning a row in said second half and before scanning a corresponding row in said first half;
   wherein S and L are related by an overlap (OVLP) of adjacent rows as follows:

$S=(1-OVLP)L;$ and wherein scanning of said beam in said first half of said workpiece surface is performed in said first direction only and scanning of said beam in said second half of said workpiece surface is performed in said second direction only.

5. The method of claim 4 wherein OVLP is in a range of 20% to 80%.

6. The method of claim 4 wherein said generating a beam of radiation is carried out continuously without interruption during the scanning of the rows of said first and second halves of said workpiece.

* * * * *